US010462901B1

(12) United States Patent
Connor et al.

(10) Patent No.: US 10,462,901 B1
(45) Date of Patent: Oct. 29, 2019

(54) IMPLEMENTING EMBEDDED WIRE REPAIR FOR PCB CONSTRUCTS

(71) Applicant: International Business Machines Corporation, Armonk, NY (US)

(72) Inventors: Samuel Connor, Apex, NC (US); Stuart B. Benefield, Durham, NC (US); Matthew S. Doyle, Chatfield, MN (US); Joseph Kuczynski, North Port, FL (US); Jonathan Jackson, Cedar Grove, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/046,518

(22) Filed: Jul. 26, 2018

(51) Int. Cl.
| H05K 3/42 | (2006.01) |
|---|---|
| H05K 3/40 | (2006.01) |
| H05K 1/11 | (2006.01) |
| H05K 1/02 | (2006.01) |
| H05K 1/09 | (2006.01) |
| H05K 3/00 | (2006.01) |

(52) U.S. Cl.
CPC ........... *H05K 1/115* (2013.01); *H05K 1/0251* (2013.01); *H05K 1/09* (2013.01); *H05K 3/0047* (2013.01); *H05K 3/42* (2013.01); *H05K 2201/09681* (2013.01); *H05K 2203/163* (2013.01); *H05K 2203/173* (2013.01)

(58) Field of Classification Search
CPC ........ H05K 3/225; H05K 3/0091; H05K 3/46; H05K 2203/163; H05K 2201/09681; H05K 2203/173; H05K 1/115; H05K 1/0251; H05K 1/09; H05K 3/42; H05K 3/0047; Y10T 29/49718; Y10T 29/49004; Y10T 29/49732–49744
USPC .................... 29/593, 402.01, 402.09–402.16
See application file for complete search history.

(56) References Cited

U.S. PATENT DOCUMENTS

| 4,683,652 A * | 8/1987 | Hatfield | H05K 3/225 174/261 |
|---|---|---|---|
| 5,247,735 A * | 9/1993 | Parry | H05K 3/225 29/846 |
| 5,290,970 A * | 3/1994 | Currie | H05K 3/225 174/250 |
| 5,809,641 A * | 9/1998 | Crudo | H05K 3/3436 228/119 |
| 6,172,879 B1 * | 1/2001 | Cilia | H05K 3/225 174/260 |
| 6,518,517 B2 * | 2/2003 | Baechtle | H05K 3/225 174/251 |
| 6,651,322 B1 * | 11/2003 | Currie | H05K 3/225 174/260 |

(Continued)

FOREIGN PATENT DOCUMENTS

| CN | 101290890 B | 7/2011 |
|---|---|---|
| CN | 103002659 A | 3/2013 |
| JP | 2016072362 A | 5/2016 |

*Primary Examiner* — Peter Dungba Vo
*Assistant Examiner* — Kaying Kue
(74) *Attorney, Agent, or Firm* — Joan Pennington

(57) ABSTRACT

Methods and structures are provided for implementing embedded wire repair for printed circuit board (PCB) constructs. A repair wire layer is provided within the PCB stack with reference planes on opposite sides of the repair wire layer. When a repair connection is required, an appropriate plated through hole (PTH) is drilled to form the repair connection using the repair wire layer.

8 Claims, 5 Drawing Sheets

(56) References Cited

U.S. PATENT DOCUMENTS

| | | | |
|---|---|---|---|
| 6,705,006 B2* | 3/2004 | Baechtle | H05K 3/225 |
| | | | 174/251 |
| 7,363,688 B2* | 4/2008 | McAllister | H05K 1/0231 |
| | | | 29/402.01 |
| 7,889,510 B2 | 2/2011 | Takeuchi et al. | |
| 8,064,218 B2 | 11/2011 | Suto et al. | |
| 9,295,163 B2 | 3/2016 | Hu | |
| 2002/0166696 A1* | 11/2002 | Chamberlin | H05K 3/225 |
| | | | 174/262 |
| 2008/0081492 A1* | 4/2008 | Sawatari | H01R 13/6658 |
| | | | 439/83 |
| 2009/0223710 A1* | 9/2009 | Becker | H05K 3/4038 |
| | | | 174/264 |
| 2009/0242254 A1 | 10/2009 | Suto et al. | |
| 2010/0051085 A1* | 3/2010 | Weidman | H01L 31/022441 |
| | | | 136/244 |
| 2011/0111562 A1* | 5/2011 | San Antonio | H01L 21/4832 |
| | | | 438/113 |
| 2012/0012369 A1 | 1/2012 | Kato | |
| 2013/0015166 A1* | 1/2013 | Li | B23K 26/032 |
| | | | 219/121.67 |
| 2013/0341077 A1* | 12/2013 | Ouchi | H05K 3/225 |
| | | | 174/264 |
| 2015/0021070 A1 | 1/2015 | Nakamura et al. | |
| 2016/0157340 A1 | 5/2016 | Hu | |

\* cited by examiner

IMPLEMENTING EMBEDDED WIRE REPAIR FOR PCB CONSTRUCTS

FIELD OF THE INVENTION

The present disclosure relates generally to the data processing field, and more particularly, relates to methods and structures for implementing embedded wire repair for printed circuit board (PCB) constructs.

BACKGROUND

As used in the present specification and claims, the terms circuit board, printed circuit board or PCB means a substrate or multiple layers (multi-layer) of substrates used to electrically attach electrical components and should be understood to generally include circuit cards, printed circuit cards, backplanes, printed wiring cards, printed wiring boards, flex circuits, and ceramic or organic chip packaging substrates.

There are a number of processes that exist to repair incorrect circuit connections of a printed circuit board construct. Such scenarios are often discovered during initial hardware bring-up activities, wherein insufficient time and money is available to completely redesign the printed circuit board. Such situations, specialized rework is performed to the existing hardware to correct the circuit wiring at the surface layer, using repair technique called yellow wire repair or rework. A drawback to the use of yellow wire rework is that the circuit connections are not performed at the physical layers intended where the error connection occurs and the resulting characteristic impedance and electrical performance (channel loss) will be substantially degraded. Additionally, these conventional types of rework solutions are not cost effective or efficient. These conventional types of rework solutions are mostly appropriate only for lab-use-only scenarios.

SUMMARY

Principal aspects of the present disclosure are to provide methods and structures for implementing embedded wire repair for printed circuit board (PCB) constructs. Other important aspects of the present disclosure are to provide such methods and structures substantially without negative effects and that overcome many of the disadvantages of prior art arrangements.

In brief, methods and structures are provided for implementing embedded wire repair for printed circuit board (PCB) constructs. A repair wire layer is provided within the PCB stack with reference planes on opposite sides of the repair wire layer. When a repair connection is required, an appropriate plated through hole (PTH) is drilled to form the repair connection using the repair wire layer.

In accordance with features of the disclosure, the repair wire layer includes one of an embedded isolated internal conductor, an embedded isolated conductive mesh inner layer, an embedded isolated embroidered wire mesh, an embedded isolated twisted-pair mesh, and multiple individual embedded wires isolated from all other wiring layers with respective individual embedded wires routed to respective plated through holes (PTHs) in the PCB stack.

In accordance with features of the disclosure, the repair wire layer includes an electrically conductive conductor or mesh formed of a selected material from a group including copper, copper plated with nickel, and aluminum. The repair wire layer includes the electrically conductive conductor or mesh separated from plated through holes (PTHs) in the PCB stack.

In accordance with features of the disclosure, the repair wire layer includes an embedded isolated embroidered wire mesh separated from plated through holes (PTHs) in the PCB stack.

BRIEF DESCRIPTION OF THE DRAWINGS

The present disclosure together with the above and other objects and advantages may best be understood from the following detailed description of the preferred embodiments of the disclosure illustrated in the drawings, wherein.

DETAILED DESCRIPTION OF THE PREFERRED EMBODIMENTS

In the following detailed description of embodiments of the disclosure, reference is made to the accompanying drawings, which illustrate example embodiments by which the disclosure may be practiced. It is to be understood that other embodiments may be utilized and structural changes may be made without departing from the scope of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the disclosure, methods and structures are provided for implementing embedded wire repair for printed circuit board (PCB) constructs.

Figure 1:
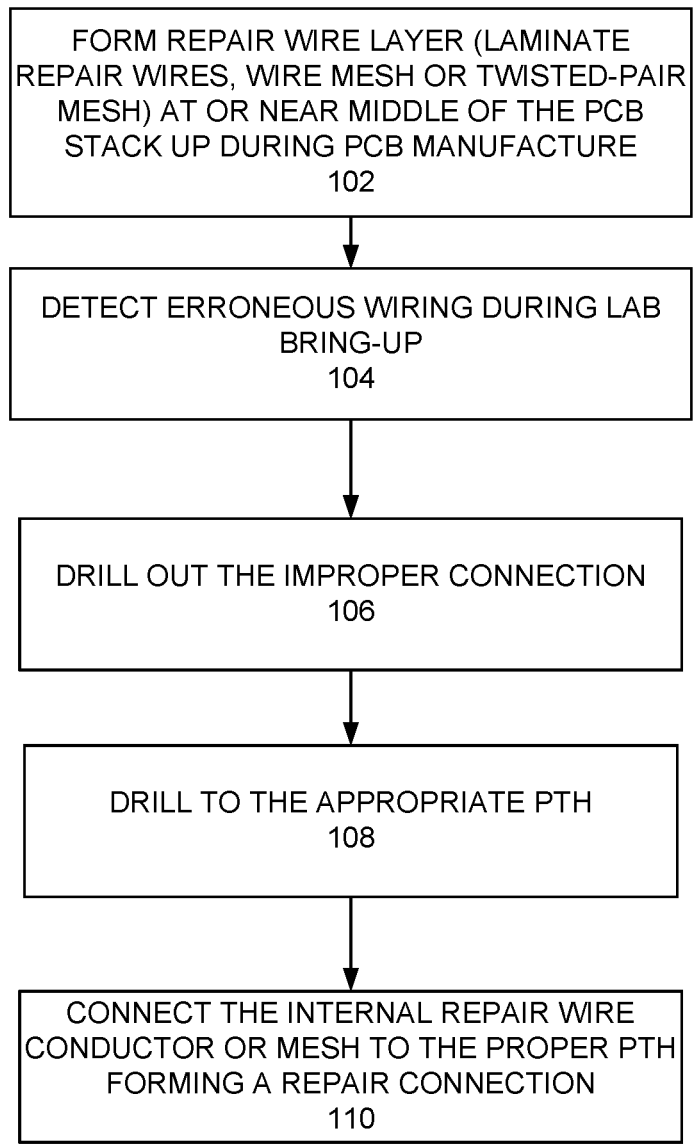
FIG. 1 is a flow chart illustrating example steps for implementing embedded wire repair for printed circuit board (PCB) constructs in accordance with an illustrative embodiment.

Referring now to FIG. 1, there is shown a flow chart illustrating example steps for implementing embedded wire repair for printed circuit board (PCB) constructs generally designated by the reference character 100 in accordance with a preferred embodiment. Referring also to FIGS. 2-5, there are shown an example PCB constructs or structures for implementing embedded wire repair for printed circuit board (PCB) constructs in accordance with preferred embodiments.

In FIG. 1, as indicated at a block 102, a repair wire layer is formed at or near a middle of the PCB stack during PCB manufacture including laminating repair wires, wire mesh or twisted-pair mesh to electrically isolate the repair wire conductors or electrically conductive mesh. For example, the repair wire layer includes one of an embedded isolated internal conductor, an embedded isolated conductive mesh inner layer, an embedded isolated embroidered wire mesh, an embedded isolated twisted-pair mesh, and multiple individual embedded wires isolated from all other wiring layers with respective individual embedded wires routed to respective plated through holes (PTHs) in the PCB stack. The repair wire layer 202 illustrated in FIGS. 2-5 includes isolated conductors or an electrically conductive mesh formed of a selected material including copper, copper plated with nickel, and aluminum. The repair wire layer 202 includes a mesh of embedded wires isolated from other wiring layers so that cross talk and other noise issues are avoided, and there are no exposed repair wires that could be snagged, corroded or the like. The repair wire layer 202 enables a controlled impedance due to solid planes at a fixed distance from the repair wires.

As indicated at a block 104, erroneous wiring is detected during lab bring-up. An improper connection is drilled out as indicated at a block 106. Next an appropriate plated through hole (PTH) for forming a repair connection is drilled out as indicated at a block 108. The internal repair wire conductor or mesh is connected to the proper PTH forming a repair connection as indicated at a block 110.

FIGS. 2, 3, 4, and 5 are respective side views not to scale schematically illustrating example embedded repair wire operations in a PCB construct in accordance with a preferred embodiment.

Figure 2:
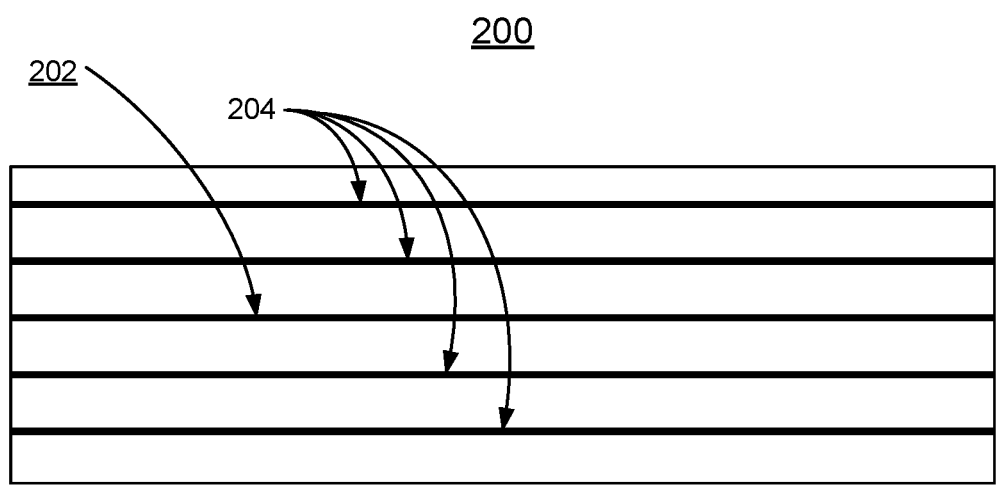
FIG. 2 is a side view not to scale schematically illustrating an example structure including an embedded repair wire layer in a PCB construct for implementing embedded repair wire operations in a PCB construct in accordance with an illustrative embodiment.

Referring to FIG. 2, there is shown a side view not to scale schematically illustrating an example structure including an embedded repair wire layer in a PCB construct generally designated by the reference character 200 for implementing embedded repair wire operations in a PCB construct in accordance with a preferred embodiment. Structure 200 includes a printed circuit board (PCB) structure 200 having a repair wire layer 202 within a PCB stack with reference planes 204 on opposite sides of the repair wire layer 202.

In accordance with features of the disclosure, in an embodiment of the disclosure forming the repair wire layer 202 includes tailoring the repair mesh to a point-to-point connection after the erroneous wiring was detected. That is, for example, future boards would be built using the existing artwork, but instead of an embedded repair wire mesh, individual embedded wires that are routed to the proper PTH would be utilized in the PCB layup. An advantage of the repair wire layer 202 is that the embedded wires are isolated from all other wiring layers with cross talk and other noise issues thereby avoided. By using the repair wire layer 202, there are no exposed yellow wires and a controlled impedance is enabled due to the solid planes at a fixed distance from the wires.

In accordance with features of the disclosure, repair wire layer 202 within a PCB stack is created using conventional PCB processing. For example, following an embroidery process, a woven cloth is impregnated with a suitable lamination resin (e.g., epoxy, PPO, or other conventional resin) and B-staged in a treater tower. Upon exiting the tower, a pre-circuitized core is ready for lay up into a multilayer construction. The pre-circuitized cores are stacked and registered to one another with interleaving prepreg. Following a conventional lamination cycle, a multilayer board is fabricated by subjecting the stack to conventional drilling, de-smear, and plating processes. Once erroneous connections are deleted, the proper PTH is connected to the embroidered traces using conventional technique.

Figure 3:
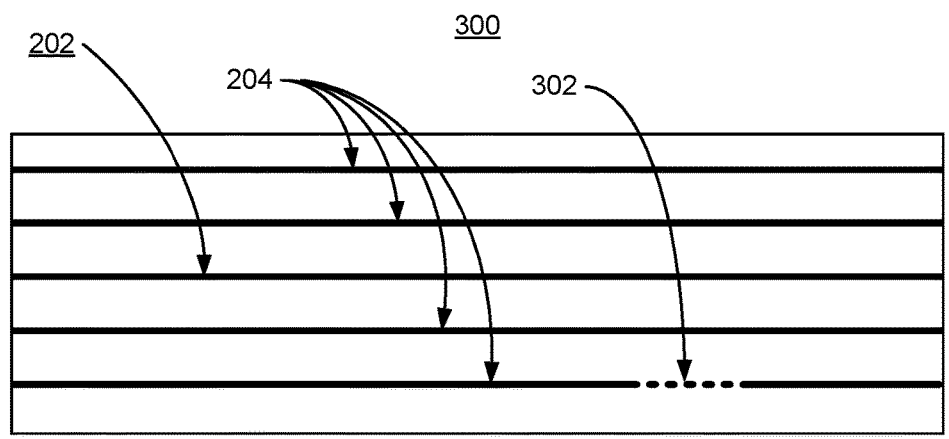
FIGS. 3, 4, and 5 are respective side views not to scale schematically illustrating example embedded repair wire operations in a PCB construct in accordance with an illustrative embodiment.

Referring to FIG. 3, there is shown a side view not to scale schematically illustrating an example structure including an embedded repair wire layer 202 in a PCB construct generally designated by the reference character 300 for implementing embedded repair wire operations in a PCB construct in accordance with a preferred embodiment. PCB structure 300 includes erroneous wiring 302 detected, for example during lab bring-up.

Figure 4:
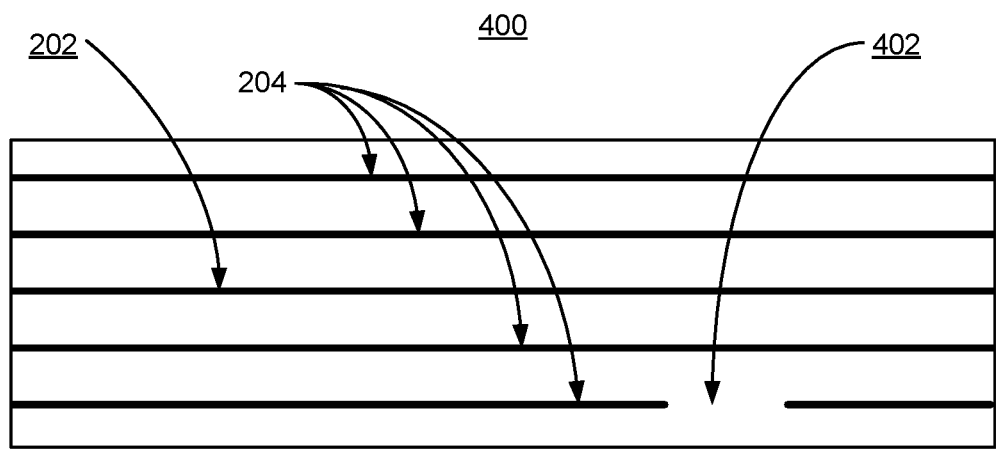

Referring to FIG. 4, there is shown a side view not to scale schematically illustrating an example structure including an embedded repair wire layer 202 in a PCB construct generally designated by the reference character 400 for implementing embedded repair wire operations in a PCB construct in accordance with a preferred embodiment. PCB structure 400 includes erroneous wiring or improper connection 402 drilled out.

Figure 5:
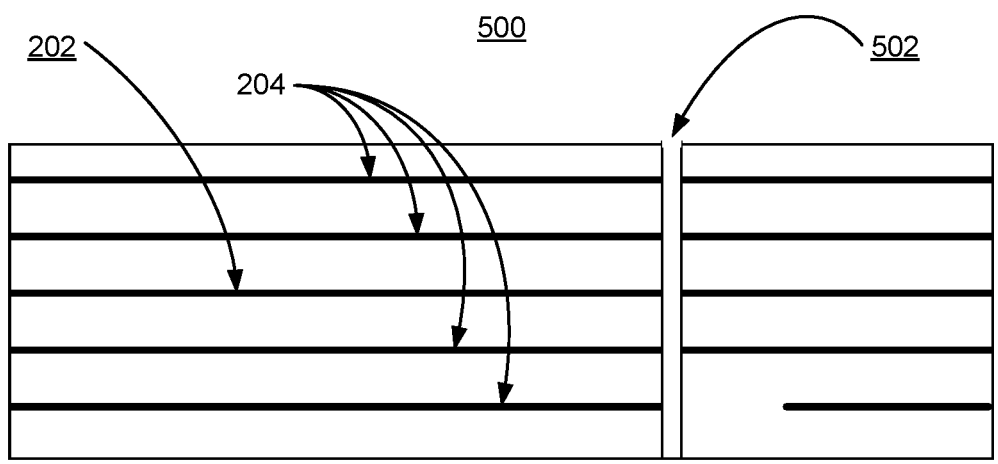

Referring to FIG. 5, there is shown a side view not to scale schematically illustrating an example structure including an embedded repair wire layer 202 in a PCB construct generally designated by the reference character 500 for implementing embedded repair wire operations in a PCB construct in accordance with a preferred embodiment. PCB structure 300 includes an appropriate plated through hole (PTH) 502 for forming a repair connection drilled out. The internal repair wire conductor or mesh 202 is connected to the proper PTH 502 forming a repair connection. For example, the connection between the embedded repair wire and the required PTH 502 is enabled via solder or a conductive adhesive that is dispensed into the PTH.

In accordance with features of the disclosure, repair connections implemented using the embedded repair wire layer 202 enable controlled impedance with respective reference planes 204 disposed at a fixed distance from said repair wire layer 202. Repair connections implemented using the embedded repair wire layer 202 provides enhanced channel performance over conventional repair work at a surface level of the PCB stack.

In accordance with features of the disclosure, as shown in FIGS. 2-5, the example structures 200, 300, 400 and 500 include the repair wire layer 202 that is isolated from all other wiring layers. Repair connections implemented using the embedded repair wire layer 202 do not render electrical stubs that typically result from conventional rework processes. Repair connections implemented using the embedded repair wire layer 202 can provide a board repair after components are mounted. The rework repair processes using the repair wire layer 202 is not limited to surface wiring and does not require additional drying and plating steps. The rework repair processes using the repair wire layer 202 does not require external PCB conductive structure and enables the ability to easily rework and repair PCB constructs.

It should be understood that the present disclosure is not limited to the illustrated PCB constructs 100, 200, 300, 400, 500 including the illustrated repair wire layer 202.

While the present disclosure has been described with reference to the details of the embodiments of the disclosure shown in the drawing, these details are not intended to limit the scope of the disclosure as claimed in the appended claims.

What is claimed is:

1. A method for implementing embedded wire repair for printed circuit board (PCB) constructs comprising:
   providing a printed circuit board (PCB) having an embedded repair wire layer in a PCB construct within a PCB stack with reference planes on opposite sides of the repair wire layer;
   detecting erroneous wiring of said embedded repair wire layer in the PCB construct;
   drilling an appropriate plated through hole (PTH) in the PCB stack for forming a repair connection in the erroneous wiring of said embedded repair wire layer;

wherein providing said embedded repair wire layer within the PCB stack includes providing multiple individual embedded wires within said embedded repair wire layer isolated from all other wiring layers; and wherein providing said multiple individual embedded wires isolated from all other wiring layers includes routing respective individual embedded wires to respective plated through holes (PTHs) in the PCB stack.

2. The method as recited in claim 1 wherein providing said repair wire layer within the PCB stack includes providing an isolated internal conductor.

3. The method as recited in claim 2 wherein providing said isolated internal conductor includes separating said isolated internal conductor from plated through holes (PTHs) in the PCB stack.

4. The method as recited in claim 1 wherein providing said repair wire layer within the PCB stack includes providing an isolated conductive wire mesh.

5. The method as recited in claim 1 wherein said repair wire layer within the PCB stack includes providing an isolated twisted-pair mesh.

6. The method as recited in claim 1 wherein providing said repair wire layer within the PCB stack includes providing an embedded isolated embroidered wire mesh.

7. The method as recited in claim 1 includes forming the repair connection using said repair wire layer avoids rendering electrical stubs.

8. The method as recited in claim 1 includes forming the repair connection using said repair wire layer without using connection pads on surface layers of the PCB stack.

* * * * *